United States Patent
Nakasuji et al.

(10) Patent No.: US 6,707,240 B1
(45) Date of Patent: Mar. 16, 2004

(54) ELECTRON GUN AND ELECTRON BEAM EXPOSURE DEVICE

(75) Inventors: Mamoru Nakasuji, Yokohama (JP); Kazuya Okamoto, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/890,959

(22) PCT Filed: Feb. 8, 2000

(86) PCT No.: PCT/JP00/00669
§ 371 (c)(1),
(2), (4) Date: Sep. 28, 2001

(87) PCT Pub. No.: WO00/48224
PCT Pub. Date: Aug. 17, 2000

(30) Foreign Application Priority Data

Feb. 9, 1999 (JP) .............................. 11-30921

(51) Int. Cl.[7] .......................... H01J 1/15; H01J 19/08; H01J 1/02
(52) U.S. Cl. ..................................... 313/341
(58) Field of Search ................ 313/449, 450, 313/454, 446, 341

(56) References Cited

U.S. PATENT DOCUMENTS

| 3,983,443 A | * | 9/1976 | Schade |
| 4,611,146 A | * | 9/1986 | Morrison ............... 313/446 |
| 4,717,855 A | * | 1/1988 | Zwier et al. |
| 5,416,381 A | * | 5/1995 | Scarpetti et al. ........... 313/446 |
| 5,933,217 A | * | 8/1999 | Nakasuji et al. ............. 355/53 |
| 6,456,019 B1 | | 9/2002 | Gordon et al. |
| 6,590,216 B1 | | 7/2003 | Doran et al. |

FOREIGN PATENT DOCUMENTS

| JP | U 59-105759 | 7/1984 |
| JP | A 04-051438 | 2/1992 |
| JP | A 05-174702 | 7/1993 |
| JP | U 7-32847 | 6/1995 |
| JP | A 10-223164 | 8/1998 |

* cited by examiner

*Primary Examiner*—Sandra O'Shea
*Assistant Examiner*—Sumati Krishnan
(74) *Attorney, Agent, or Firm*—Oliff & Berridge PLC (57) ABSTRACT

An electron gun includes a plate-like main cathode 77 having an electron emitting surface 79 and a sub-cathode 81 provided toward the rear surface of the main cathode to heat the main cathode 77 by imparting an electron bombardment. The sub-cathode 81 is constituted of filaments 83 and 85 coiled in a double helix structure and the diameter of the sub-cathode 81 is larger than the diameter of the main cathode 77. As a result, the temperature at the peripheral area of the electron emitting surface 79 can be set higher than the temperature at the center, to achieve an electron beam with a uniform intensity distribution.

8 Claims, 6 Drawing Sheets

```
S11
┌─────────────────────────┐
│ RESIST APPLICATION STEP │
└─────────────────────────┘
            │
            ▼
S12
┌─────────────────────────┐
│      EXPOSURE STEP      │
└─────────────────────────┘
            │
            ▼
S13
┌─────────────────────────┐
│     DEVELOPING STEP     │
└─────────────────────────┘
            │
            ▼
S14
┌─────────────────────────┐
│     ANNEALING STEP      │
└─────────────────────────┘
```

LITHOGRAPHY STEP

ELECTRON GUN AND ELECTRON BEAM EXPOSURE DEVICE

The disclosure of the following priority application is herein incorporated by reference: Japanese Patent Application No. H 11-30921.

TECHNICAL FIELD

The present invention relates to an electron gun capable of emitting an electron beam with high emittance suited for use in an electron beam exposure apparatus.

BACKGROUND ART

Figure 4:
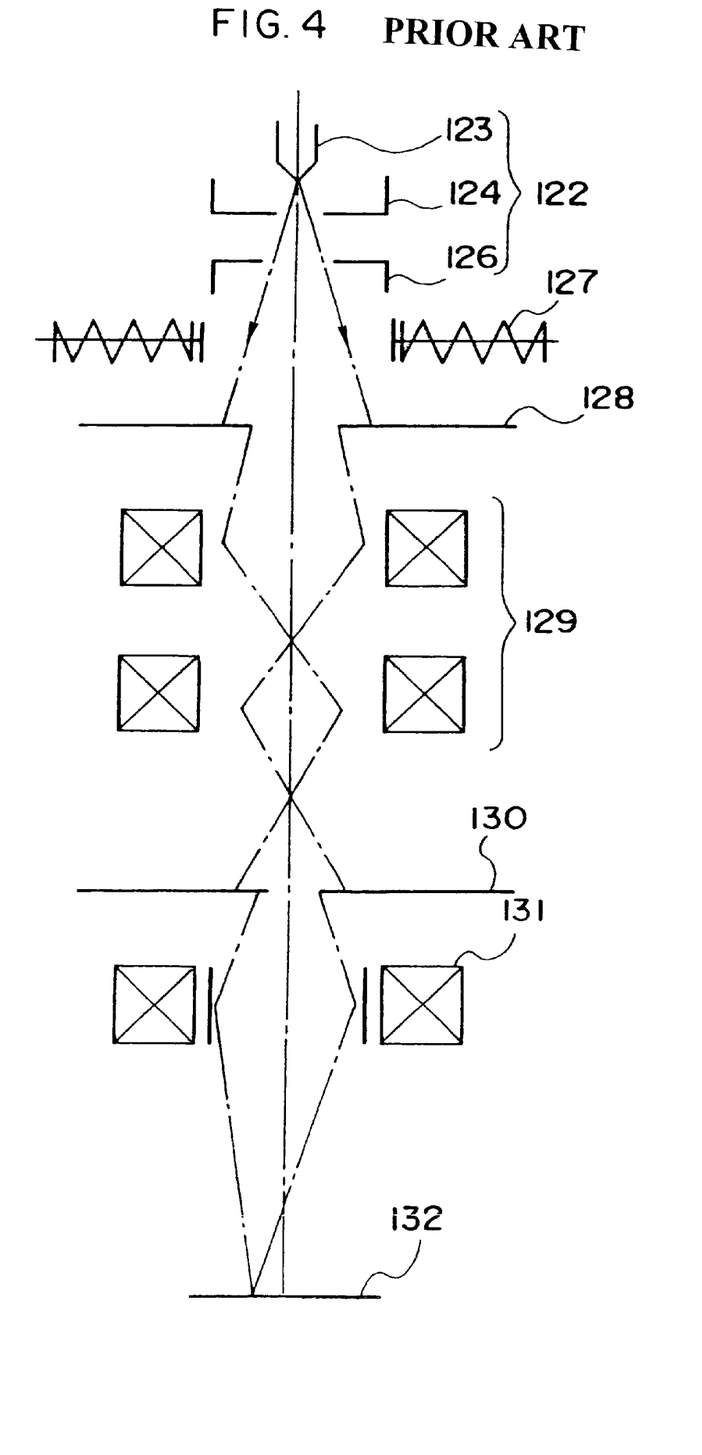
FIG. 4 schematically illustrates a standard structure adopted in electron beam lithography apparatuses.

FIG. 4 schematically illustrates a standard structure adopted in electron beam lithography apparatuses. An electron gun 122 comprises a cathode 123, a Wehnelt 124 and an anode 126. The center of an electron beam EB emitted from the electron gun 122 is adjusted to align with the optical axis at an alignment coil 127 and the peripheral unfocused portion is cutoff at a first aperture 128. Then, the electron beam EB passes through a reducing lens system 129 where, the beam diameter becomes reduced, and is focused through an objective lens 131 onto a surface to be drawn 132. It is to be noted that although not shown, a deflecting electrode is provided between a second aperture 130 and the surface to be drawn 132.

A negative voltage of 10~100 kV is applied to the cathode 123 heated to a high temperature (e.g., 1200° C.). The potential at the anode 126 is normally set at 0V, and an electron beam is emitted from the cathode 123 toward the anode 126. The Wehnelt 124 achieves a potential a slightly lower than that at the cathode 123, i.e., a voltage that is negative relative to the voltage at the cathode 123 is applied to the Wehnelt 124. As a result, an electric field, in which the electron beam traveling from the cathode 123 toward the anode 126 is set closer to the optical axis, is formed. The electron beam originating from the cathode 123 is accelerated as it advances toward the anode 126, and passes through a central hole formed at the center of the anode 126 to travel in the downward direction in the figure.

In such an electron gun used in an electron beam exposure apparatus adopting a probe forming method which is employed for drawing pattern, the electron emitting surface (area) at the front end of the cathode is pointed to achieve a high level of brightness.

In addition, cathodes having wide and flat electron emitting surface (e.g., a cathode having an electron emitting surface with a 0.2 mm diameter) have been developed for application in electron beam exposure apparatuses adopting the cell projection method in which projection exposure is implemented over a small area (e.g., a 5×5 $\mu$m area on a reticle), in order to achieve high emittance characteristics.

As a means for heating such a flat cathode (referred to as the main cathode), a sub-cathode is provided toward the rear surface of the main cathode to impart an electron bombardment from the sub-cathode to the rear surface of the main cathode in the known art. In order to prevent the electron beam originating from the main cathode from becoming bent, the sub-cathode is constituted by using a filament coiled to achieve minimum induction.

It is also known that a highly uniform temperature distribution maybe achieved at the electron emitting surface even when heat is input to the main cathode unevenly by setting the thickness t of the main cathode relatively large to satisfy the following expression (see Electron Ion Beam Handbook 2.2.1 (2), p23, 24).

$$t > Qa^2/5kT$$

It is to be noted that in the above expression, a represents the radius of the main cathode, Q represents the density of the quantity of heat input to the main cathode, k represents the heat conductivity of the main cathode material and T represents the cathode operating temperature.

DISCLOSURE OF THE INVENTION

The dimensions of an illumination beam on a reticle in an electron beam exposure apparatus adopting a divided-pattern transfer method, the use of which is currently being considered for application in the exposure process implemented to manufacture next-generation semiconductor devices such as 4G DRAMs and the like, may be, for instance, 1 mm×1 mm. The diameter of the electron emitting surface of an electron gun that may be employed in such an electron beam exposure apparatus is 8 mm, and the electron gun achieves a beam current of 100 $\mu$A at the reticle and a 2 mm mrad emittance.

However, there is a problem with the electron gun in the prior art having a flat cathode in that the intensity of the electron beam is lowered at the circumferential area of the main cathode.

In addition, while the filament at the sub-cathode in the known art is often constituted by concentrically coiling two lines that are aligned with each other, such a filament structure does not achieve a sufficient degree of non-inductive characteristics, and thus, the magnetic field attributable to the current flowing through the filament may adversely affect the electron beam emitted from the main cathode.

An object of the present invention is to provide an electron gun capable of emitting a large beam achieving a more uniform intensity distribution.

Another object of the present invention is to provide an electron gun capable of minimizing the degree to which an electron beam emitted from the main cathode becomes bent.

Yet another object of the present invention is to provide an electron beam exposure apparatus capable of performing exposure by using a large beam achieving a more uniform intensity distribution.

In order to achieve the objects described above, the electron gun according to the present invention comprises a main cathode having an electron emitting surface at one surface of a plate member and a sub-cathode facing opposite another surface of the main cathode, with a filament coiled to achieve a double helix structure constituting the sub-cathode. By utilizing the filament coiled in a double helix structure as described above, the magnetic fields caused by the currents flowing through the adjacent filaments can be canceled out by each other, to ultimately minimize the degree to which the electron beam emitted from the main cathode becomes bent.

In addition, by setting the temperature at the outer circumferential area of the electron emitting surface of the main cathode higher than the temperature at the remaining area of the electron emitting surface, an electron beam with a uniform intensity distribution is obtained. For instance, by allowing the sub-cathode to expand further outward relative to the outer circumferential area of the main cathode and thus setting the area of heat application surface of the sub-cathode larger than the area of the main cathode, the temperature at the outer circumferential area of the electron emitting surface can be set higher than the temperature at the center.

Furthermore, an electron beam achieving a uniform intensity distribution can be obtained by constituting the sub-cathode of the electron gun with a filament coiled in a double helix structure and setting the ratio of the external diameter of the double helix and the diameter of the main cathode so as to optimize the density of the electrons flowing from the sub-cathode to the main cathode or the cathode radius directional dependency of the temperature at the electron emitting surface of the main cathode.

At the same time, by setting the thickness t of the main cathode so as to satisfy the following expression, a temperature distribution that better reflects the current density with regard to the electron bombardment at the rear surface of the main cathode can be achieved with ease to ultimately realize a better temperature distribution along the radial direction of the electron emitting surface.

$$t < 5Qa^2/kT$$

with a representing the radius of the main cathode, Q representing the density of the quantity of heat input to the main cathode, k representing the heat conductivity of the main cathode material and T representing the cathode operating temperature.

Also, by utilizing the electron gun described above in an electron beam exposure apparatus, highly accurate exposure can be implemented over a relatively large exposure area to improve the throughput of the exposure process.

Moreover, by employing the electron beam exposure apparatus in semiconductor device production, it becomes possible to manufacture a semiconductor device achieving a smaller line width and a higher degree of integration.

THE BEST MODE FOR CARRYING OUT THE INVENTION

Figure 3:
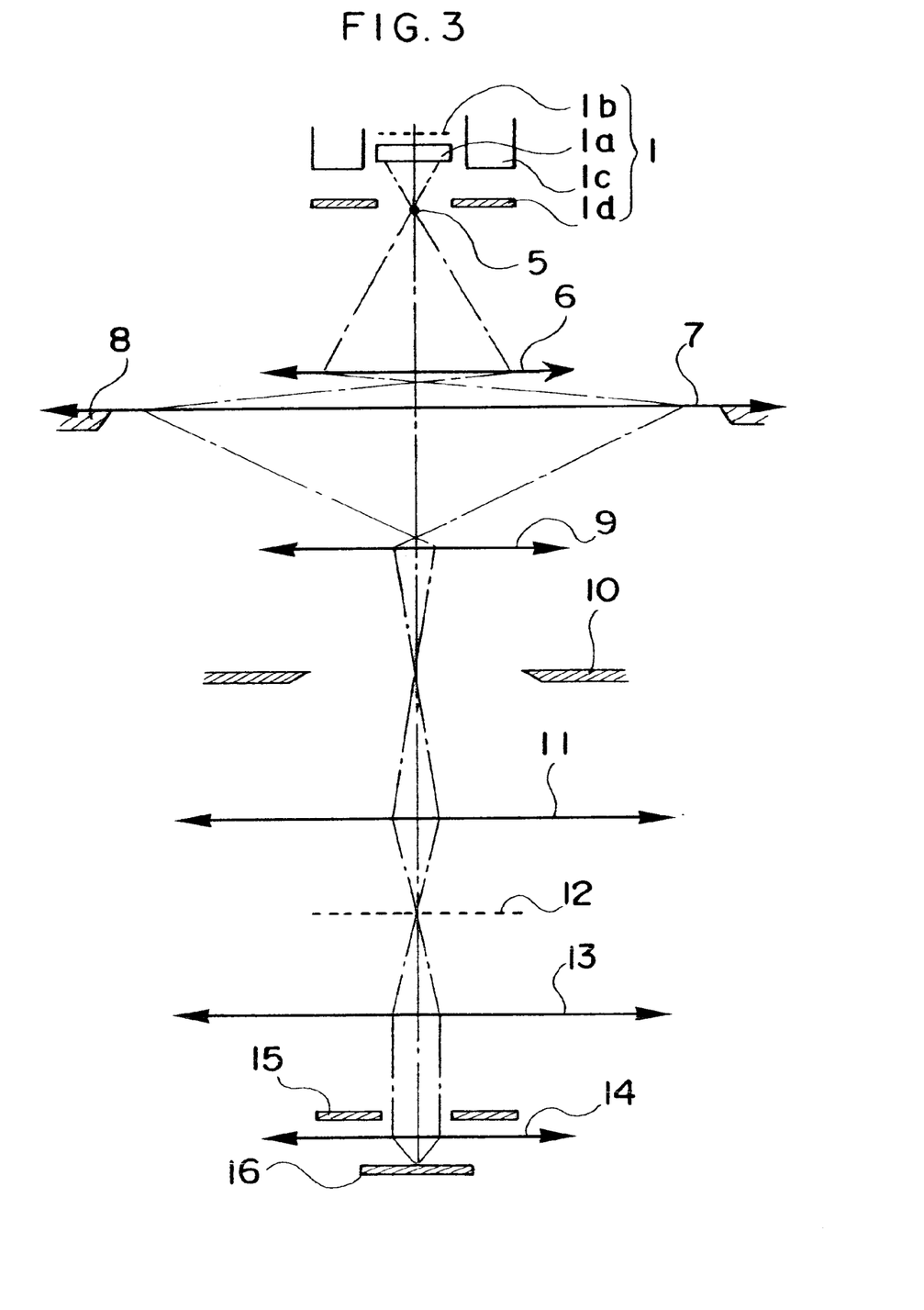
FIG. 3 shows the relationship achieved in image formation in the entire optical system in the electron beam exposure apparatus according to the present invention.

The following is an explanation of an embodiment of the present invention, given in reference to the drawings. FIG. 3 presents the electron beam exposure apparatus according to the present invention achieved in the embodiment and illustrates the relationship achieved in image formation in the entire optical system. An electron gun 1 located at the upstream-most position of the optical system includes four electrodes, i.e., a sub-cathode 1b, a main cathode 1a, a Wehnelt 1c and an anode 1d, and radiates an electron beam in the downward direction in the figure.

A negative voltage (accelerating voltage), e.g., a −100kV voltage, is applied to the main cathode 1a. The sub-cathode 1b, which is constituted of double helix filaments, heats the main cathode 1a by imparting an electron bombardment to the main cathode 1a. Examples of structures that may be adopted in the main cathode 1a and the sub-cathode 1b are to be explained in detail later. The anode 1d is provided with a hole at its center, through which an electron beam passes and is normally set at 0 V (ground level). A negative voltage of −100.02kV is applied to the Wehnelt 1c surrounding the cathode 1a in a ring shape. The Wehnelt 1c shifts the electron beam emitted from the cathode 1a toward the optical axis.

In this electron gun 1, an electron beam is radiated from an electron emitting surface at the bottom of the main cathode 1a, and the electron beam forms a crossover 5 directly under the anode 1d (near the downstream side of the anode 1d). Condenser lenses 6 and 7 are provided over two stages under the electron gun 1. The electron beam originating from the crossover 5 is radiated onto a beam-shaping aperture 10 to be detailed later via the condenser lenses 6 and 7. At this point, the crossover image becomes enlarged by the condenser lenses 6 and 7 over the two stages. Inside the condenser lens 7, a shaping aperture 8 is provided and the electron beam is shaped through the shaping aperture 8.

Under the shaping aperture 8, a condenser lens 9, an aperture 10 for shaping the electron beam and a condenser lens 11 are provided. An image of the aperture 10 through which the beam external outline is shaped, is formed at one of the sub-fields (small pattern areas) on a reticle 12. In addition, the rate at which the crossover dimensions are enlarged on the beam-shaping aperture 10 is controlled through the zooming function of the condenser lenses 7 and 9. Since the reticle 12 is illuminated with the crossover image, the reticle is illuminated uniformly even if the current density at the surface of the cathode 1a varies at different positions. Furthermore, since the cathode 1a is used under a temperature-controlled condition, the brightness can be adjusted in conformance to the cathode temperature.

Under the beam-shaping aperture 10, a sub field selection deflector (not shown) which allows all the sub-fields within the optical field to be illuminated including any deflection over the reticle 12 by sequentially scanning the electron beam mainly along the lateral direction in the figure is provided. In addition, a reticle stage on which the reticle is placed and a wafer stage on which a wafer 16 is placed may be moved along a direction perpendicular to the optical axis to expose an area larger than the size of the field of the optical system.

Projection lenses 13 and 14, a contrast aperture 15 and a deflector (not shown) are provided under the reticle 12. One sub field at the reticle 12 is irradiated with the electron beam, and the electron beam, having been patterned at the reticle 12 is reduced through the projection lenses 13 and 14 and is deflected by the deflector (not shown) to form an image at a predetermined position on the wafer 16. The right type of resist is applied in advance onto the wafer 16 so that a reduced pattern of the reticle image is transferred onto the wafer 16 by applying a dose of electron beam to the resist.

The contrast aperture 15 mentioned above is provided at a position at which the gap between the projection lenses 13 and 14 is divided according to the reduction ratio of the projection lenses 13 and 14. The contrast aperture 15 cuts off an unpatterned beam scattered from the reticle 12 so as to prevent it from reaching the wafer 16.

Figure 1A:
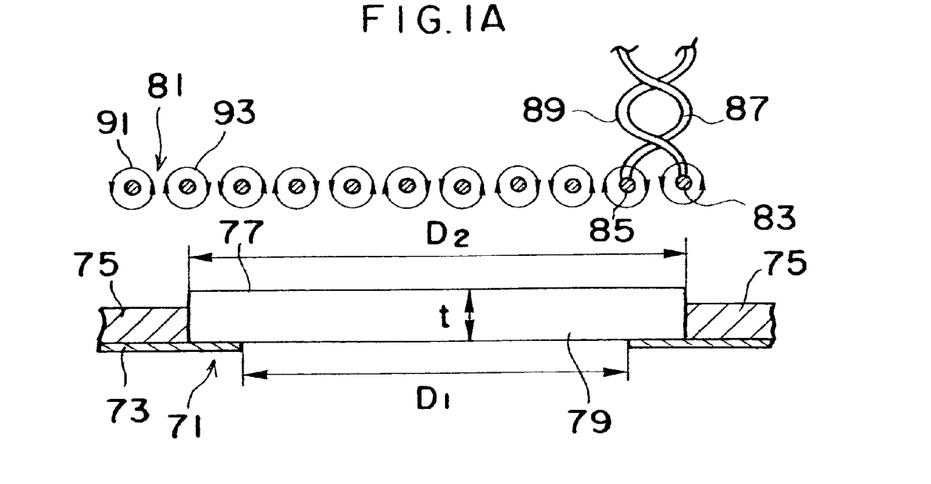
FIG. 1A is a longitudinal sectional view of the cathode in an embodiment of the electron gun according to the present invention.
Figure 1B:
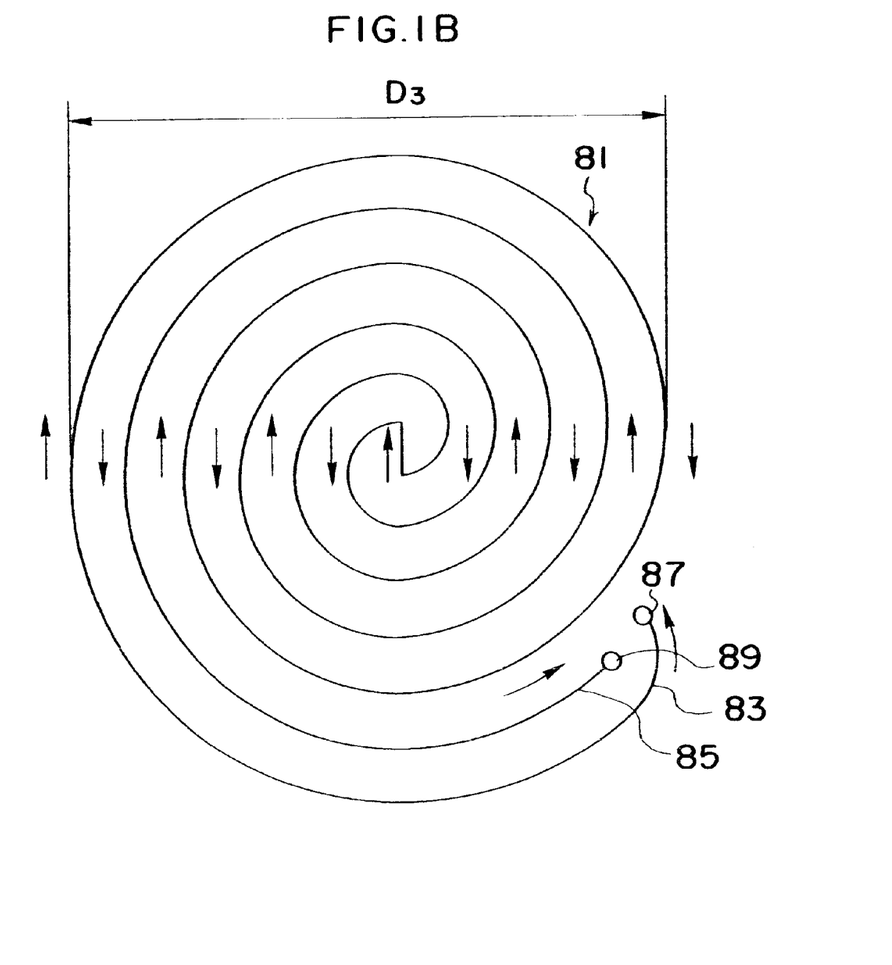
FIG. 1B is a plan view of the sub-cathode.
Figure 2:
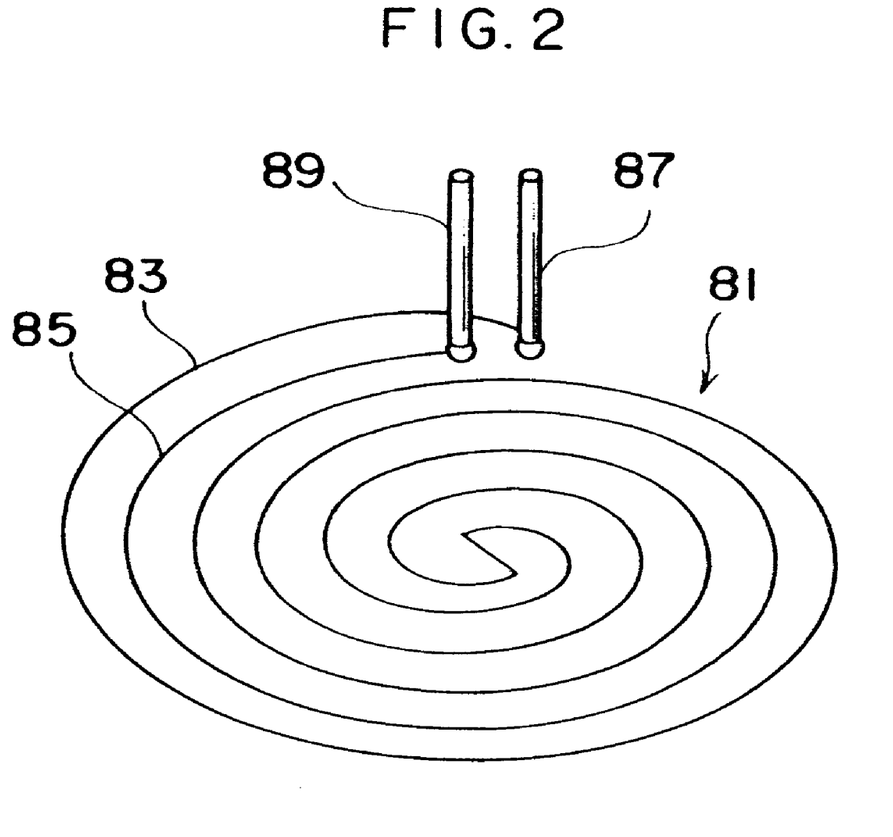
FIG. 2 is a perspective of the sub-cathode.

FIGS. 1A and 1B illustrate in detail examples of the cathodes 1a and 1b explained above, with FIG. 1A presenting a longitudinal sectional view and FIG. 1B illustrating a sub-cathode 81 viewed from a main cathode 77. FIG. 2 is a perspective of the sub-cathode 81. The cathodes shown in FIG. 1 include a main cathode unit 71 having a main cathode (main body) 77, a spacer 75 and the like and the sub-cathode 81.

The main cathode 77 is a disk constituted of Ta or the like. The circumferential area of the main cathode 77 is supported by the spacer 75 constituted of a material with a low heat conductivity such as BN. The lower surface of the main cathode 77 and the lower surface of the spacer 75 are set flush with each other as a flat surface, with the central area of the lower surface of the main cathode 77 constituting an electron emitting surface 79. The surface surrounding the electron emitting surface 79 is coated with a thin film 73 constituted of Ir or W. Since the work function of Ir or W is larger than the work function of Ta constituting the main cathode 77 (the work function of Ir, for instance, is larger by 1.2 eV), the diameter (effective diameter) of the cathode electron emitting surface 79 is determined by providing the thin film 73.

The sub-cathode 81 faces opposite the surface (the rear surface) opposite from the electron emitting surface 79 of the main cathode 77 over a specific distance. The sub-cathode 81 includes filaments 83 and 85 each constituted of a metal wire formed by using W (tungsten) or the like. While the filaments 83 and 85 are formed as a single wire, they are helically (or spirally) coiled separate from each other as shown in FIG. 1A and connected at the center. The wires of the two filaments 83 and 85 are set over a distance that remains roughly consistent regardless of the position. Power is supplied to the filaments 83 and 85 to cause them to generate red heat and emit electrons. The electrons thus emitted impart an electron bombardment to the rear surface of the main cathode 77, thereby applying heat to the main cathode 77.

The filaments 83 and 85 are supported by supporting wires 87 and 89 provided at their external circumferences. The supporting wires 87 and 89 are thicker than the filaments 83 and 85. Since power is also applied to the supporting wires 87 and 89, a magnetic field, the range of which is determined by the distance between the two wires is generated. It is desirable to minimize the distance between the supporting wire 87 and the supporting wire 89, in order to minimize the range of the magnetic field. Alternatively, the supporting wires may be "twisted wires" that helically intertwine with each other, as illustrated in FIG. 1A.

A DC current is applied to the sub-cathode 81 to heat the sub-cathode 81 to a temperature at which a sufficiently large quantity of electrons are emitted. During this process, a voltage which is lower than the voltage applied to the main cathode 77 by several kV is applied to the sub-cathode 81, and the cathode temperature is controlled by adjusting this voltage.

In this electron gun in which the diameter of the sub-cathode 81 (the external diameter formed by the helically coiled filaments 83 and 89) is larger than the diameter of the main cathode 77, an electron bombardment with a higher current density is imparted to the peripheral area of the rear surface of the main cathode 77. Thus, the temperature of the main cathode is slightly higher in the peripheral area than at the center.

The magnetic field generated when the filament heating currents are supplied in the directions indicated by the arrows in FIG. 1B only manifests locally around the filaments 83 and 85 as indicated by lines 91 and 93 in FIG. 1A, and thus, the electron gun current is hardly affected by the magnetic field.

By setting the thickness t of the main cathode 77 to a sufficiently small value that satisfies the following expression, a temperature distribution that reflects the current density with respect to the electron bombardment at the rear surface of the main cathode to a degree is achieved at the front surface.

$$t < 5Qa^2/kT$$

with a representing the radius of the main cathode, Q representing the density of the quantity of heat input to the main cathode 77, k representing the heat conductivity of the main cathode material and T representing the cathode operating temperature.

As illustrated in FIGS. 1A and 1B, since the sub-cathode 81 is larger than the main cathode 77 by a sufficient degree, an electron bombardment achieving a high current density is imparted to the peripheral area of the main cathode 77 to raise the temperature at the peripheral area of the main cathode.

A higher degree of uniformity in the intensity distribution of the beam illuminating the reticle is often achieved by generating a slightly larger current from the peripheral area of the cathode than from the cathode center in an electron gun utilized in an electron beam exposure apparatus. If a main cathode constituted of Ta is operated at 1900° K., for instance, the temperature at the peripheral area should be raised by approximately 3~15° K. If a main cathode constituted of LaB6 is operated at 1200° K., the temperature at the peripheral area should be set higher by, for instance, approximately 2~10° K. By raising the temperature at the main cathode circumferential area relative to the temperature at the central area as explained above, the current discharged from the peripheral area of the cathode is slightly increased compared to the discharge current at the central area. By utilizing such an electron gun in an electron beam exposure apparatus, it becomes possible to implement highly accurate exposure over a relatively wide range.

Through computer simulation of the temperature distribution at the cathode surface, the electron gun current density distribution and the like obtained by varying the ratio of the main cathode diameter and the sub-cathode diameter on a model approximating the actual electron gun, the ratio can be optimized. In addition, the structure of the electron gun may be incorporated in the simulation to achieve even better results by ascertaining the cathode current density distribution, which flattens the angle dependency of the current emitted from the crossover.

It is to be noted that the individual cathode parameters may assume the following specific numerical values in an example adopting the present invention.

Figure 5:
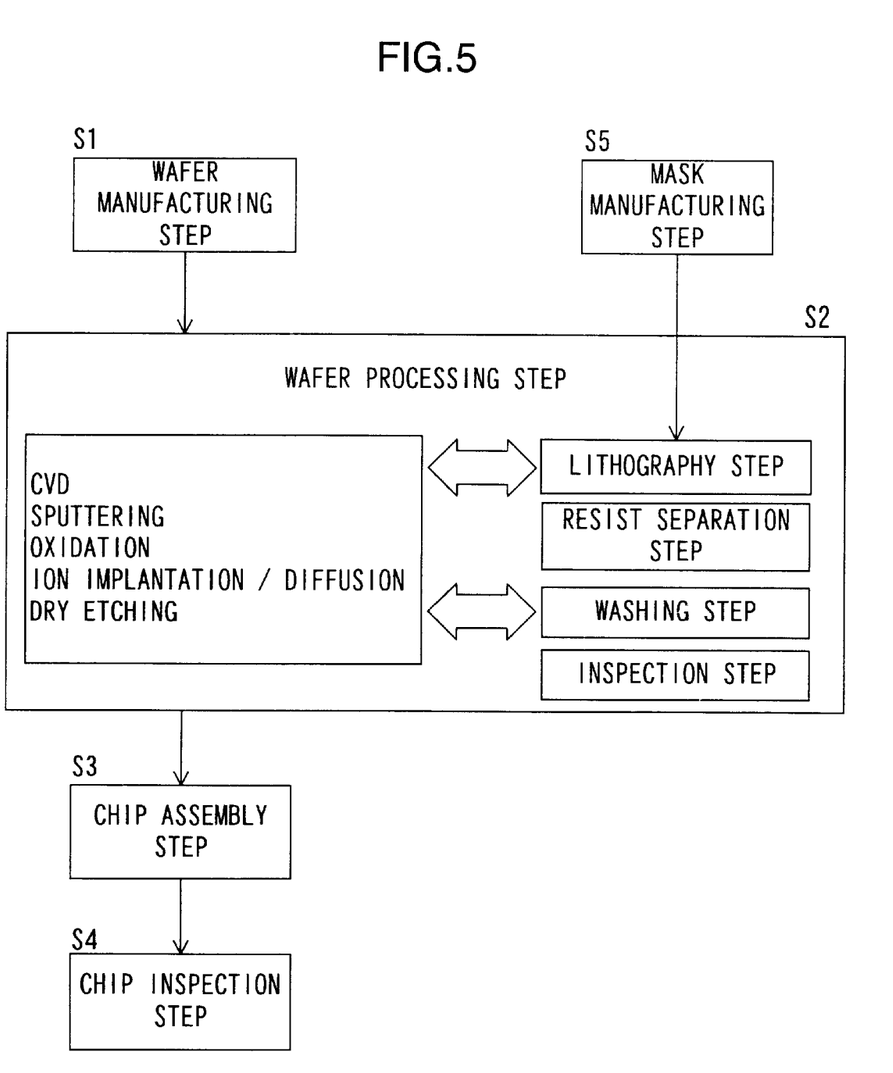
FIG. 5 is a flow chart of a semiconductor device manufacturing method.

Main cathode: thickness t=3 mm, diameter D2=10 mm, electron emitting surface diameter D1=8 mm, heat conductivity k=60 W/mK, cathode operating temperature T=1900° K., heat quantity density Q=180 W/(5×10$^{-3}$)$^2$m, sub-cathode: diameter D3=12 mm Next, an explanation is given on a semiconductor device manufacturing method in which the exposure apparatus described above may be employed. FIG. 5 is a flow chart of the semiconductor device manufacturing method, which includes a wafer manufacturing step S1 in which the wafer is manufactured, a wafer processing step S2, in which processing necessary to form chips at the wafer is implemented, a chip assembly step S3, in which the chips formed at the wafer are individually cut out and assembled into a form that enables a device operation, a chip inspection step S4, in which each completed chip is inspected and a mask manufacturing step S5, in which a mask to be used in the wafer processing step S2 is produced, as main steps.

Among these steps, the wafer processing step S2 is a crucial process that determines the performance of the manufactured semiconductor device. During the wafer processing step S2, a circuit pattern designed in advance is sequentially laminated on the wafer and numerous device chips, which are to operate as memory units or MPUs, are formed on the wafer. Accordingly, the wafer processing step S2 includes; (1) a thin film forming step in which a dielectric thin film to constitute an insulating layer, a metal thin film to constitute a wiring area or an electrode area or the like is formed through CVD, sputtering or the like, (2) an oxidation step in which the wafer substrate and the thin film layer formed through the thin film forming step are oxidized, (3) a lithography step in which a resist pattern is formed by using a mask (also referred to as a reticle) in order to selectively process the thin film layer, the wafer substrate or the like, (4) an etching step in which the thin film layer, the substrate or the like is processed through dry etching or the like by using the resist pattern, (5) an ion implantation/diffusion step in which ions and impurities are implanted and diffused, (6) a resist separation step, (7) a washing step in which the wafer is washed, (8) an inspection step in which the processed wafer is inspected and the like. It is to be noted that the wafer processing step S2 is repeatedly executed to form as many layers as necessary.

Figure 6:
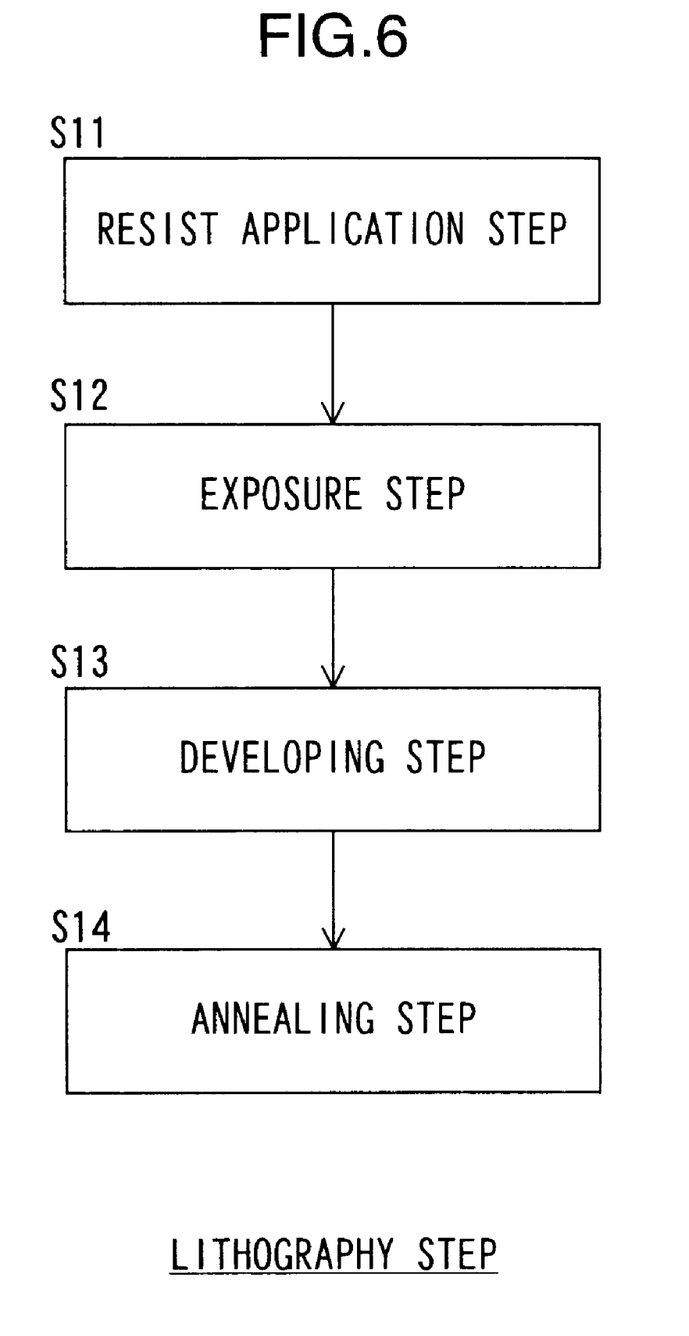
FIG. 6 is a flow chart of the lithography process implemented in wafer processing.

FIG. 6 is a flow chart of the lithography step which constitutes the most crucial part of the wafer processing step S2. After applying the resist onto the wafer in a resist application step 11, the resist is exposed with the exposure apparatus by using the mask having been prepared through the mask manufacturing step. By developing the exposed resist through a developing step S13, the pattern of the resist is obtained. This resist pattern is stabilized through the subsequent annealing step S14.

By utilizing the charged particle beam exposure apparatus according to the present invention in the exposure step S12 mentioned above, highly accurate exposure is achieved. The lithography step, in particular, is a crucial process which achieves the required minimum line width and the corresponding accurate alignment, and it is essential to carry out the exposure step S12 including the alignment control with a high degree of accuracy. By utilizing the exposure apparatus according to the present invention during this exposure step S12, highly accurate exposure can be implemented over a relatively wide exposure area to make it possible to manufacture semiconductor devices, the production of which so far has been considered not possible.

What is claimed is:

1. An electron gun comprising:
a main cathode having an electron emitting surface at one surface of a plate member; and
a sub-cathode facing opposite another surface of said plate member, said sub-cathode comprising a filament that is coiled in a double helix structure and emits electrons to heat said main cathode through an electron bombardment of the electrons.

2. An electron gun comprising:
a main cathode having an electron emitting surface at one surface of a plate member; and
a sub-cathode facing opposite another surface of said plate member, said sub-cathode emits electrons to heat said main cathode through an electron bombardment of the electrons, said sub-cathode heats an outer circumferential area of said electron emitting surface of said main cathode to a higher temperature relative to a remaining area of said electron emitting surface.

3. An electron gun according to claim 1, wherein:
an area of a heat-application surface of said sub-cathode facing opposite said main cathode is set larger than an area of the surface of said main cathode facing opposite said sub-cathode, so as to allow said sub-cathode to range further outward relative to an outer circumference of said main cathode.

4. An electron gun comprising:
a main cathode having an electron emitting surface at one surface of a plate member; and
a sub-cathode facing opposite another surface of said plate member, which heats said main cathode through an electron bombardment, wherein:
said sub-cathode comprises a filament coiled in a double helix structure; and
a ratio of an external diameter of a double helix of said filament and a diameter of said main cathode is set so as to optimize a density of electrical current flowing from the sub-cathode to the main cathode or a cathode radius directional dependency of a temperature at the electron emitting surface of the main cathode.

5. An electron gun according to claim 1, wherein:
a thickness t of said main cathode is set so as to satisfy an expression of "$t<5Qa^2/kT$", with "a" representing a diameter of said main cathode, Q representing a density of quantity of heat input to said main cathode, k representing a heat conductivity of a material constituting said main cathode and T representing a cathode operating temperature.

6. An electron beam exposure apparatus, comprising:
an electron gun that comprises a main cathode having an electron emitting surface at one surface of a plate member, and a sub-cathode facing opposite another surface of said plate member, said sub-cathode comprising a filament that is coiled in a double helix structure and emits electrons to heat said main cathode through an electron bombardment of the electrons;
an illuminating optical system that illuminates a reticle having a pattern to be transferred onto a photosensitive substrate with an electron beam emitted from said electron gun; and
a projection optical system that projects the electron beam having passed through said reticle onto said photosensitive substrate to form an image on said photosensitive substrate.

7. A semiconductor device manufacturing method that includes a lithography step, wherein:
an electron beam exposure apparatus according to claim 6 is employed during said lithography step.

8. A semiconductor device manufactured through a semiconductor device manufacturing method according to claim 7.

* * * * *